United States Patent
Kobayashi

(10) Patent No.: US 6,266,738 B1
(45) Date of Patent: Jul. 24, 2001

(54) MEMORY CONTROL PROVIDING CONTROLLABLE RATE OF REFRESH OPERATIONS

(75) Inventor: Noriyuki Kobayashi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/116,495

(22) Filed: Jul. 16, 1998

(30) Foreign Application Priority Data

Jul. 17, 1997 (JP) .................................................. 9-192800

(51) Int. Cl.$^7$ ...................................................... G06F 12/00
(52) U.S. Cl. ............................................................... 711/106
(58) Field of Search ................................... 711/105, 106, 711/167, 168; 365/222

(56) References Cited

U.S. PATENT DOCUMENTS

| | | | |
|---|---|---|---|
| 5,418,920 | * 5/1995 | Kuddes | 711/106 |
| 5,638,529 | * 6/1997 | Yee | 711/106 |
| 5,742,834 | 4/1998 | Kobayashi | 395/760 |
| 5,761,703 | * 6/1998 | Bolyn | 711/106 |
| 5,822,753 | * 10/1998 | Takano | 711/106 |
| 5,890,198 | * 3/1999 | Pawlowski | 711/106 |
| 5,991,851 | * 11/1999 | Alwais et al. | 711/106 |

* cited by examiner

Primary Examiner—Kevin Verbrugge
(74) Attorney, Agent, or Firm—Fitzpatrick, Cella, Harper & Scinto

(57) ABSTRACT

In a method controlling operations associated with a memory in such a manner that data is transferred at a high speed while performing a minimum number of refreshing operations required, a refreshing operation is temporarily performed depending on the communication status so that the contents of the memory are maintained without being lost. A DRAM controller transfers data between the memory including a DRAM and a data input-output device. A CPU controller adjusts setting values designating the frequencies of the memory read/write and refreshing operations. A control signal generator performs memory read/write and refreshing operations at rates corresponding to the setting values. This makes it possible to adjust the number of refreshing operations during a fixed period of time to an arbitrary value depending on the data transfer rate without having to perform a greater number of refreshing operations than required. If the control signal generator does not receive an ACK signal within a predetermined period of time, the control signal generator performs a timeout routine in which a refreshing operation is temporarily performed thereby preventing the contents of a memory to from being lost when no ACK signal is returned for a period of time longer than allowed.

12 Claims, 9 Drawing Sheets

SIMM1: 1, 2, 3, 4

SIMM2: 5, 6, 7, 8

SIMMk: 4k-3, 4k-2, 4k-1, 4k

| NAME | DESCRIPTION | |
|---|---|---|
| MODE | USED FOR SETTING THE OPERATION MODE | |
| RWCNTMAX | MAXIMUM NUMBER OF SUCCESSIVE READ/WRITE OPERATIONS | =10 |
| REFCNTMAX | MAXIMUM NUMBER OF SUCCESSIVE REFRESHING OPERATIONS | = 6 |
| TIMEOUT_LIM | TIMEOUT CONDITION | |
| ADRSSET | INITIAL MEMORY ACCESS ADDRESS | |
| MTYPE | MEMORY TYPE | |
| START | START OF OPERATION | |
| END | END OF OPERATION | |

MEMORY CONTROL PROVIDING CONTROLLABLE RATE OF REFRESH OPERATIONS

BACKGROUND OF THE INVENTION

1. Field of the Invention

The present invention relates to a memory controlling method and a memory controlling apparatus having communication capabilities required in transferring data between a memory including a DRAM (dynamic random access memory) divided into a plurality of blocks and a device having the capability of inputting and outputting data.

2. Description of the Related Art

According to a common technique, a DRAM is generally controlled in such a manner that read/write cycles and and refresh cycles are assigned to respective blocks of the memory so that when a read/write cycle is performed in a certain block, a refresh cycle is performed in another block, thereby ensuring that data can be transferred while maintaining the memory contents in the DRAM.

It is also known in the art to introduce competition between read/write and refresh cycles so that when a cycle is completed another cycle is started in accordance with predetermined priority, thereby ensuring that data transfer is performed without losing the contents of the DRAM.

However, in the former conventional technique, control signals are simultaneously applied to the respective blocks, and thus a large current is consumed when the control signals are simultaneously applied. That is, extremely great peaks appear in the current. Such large currents cause instantaneous variations in the power supply voltage, or result in noise. As a result, a reduction in the reliability of the apparatus occurs.

Although the latter conventional technique does not have such a problem, it has another problem that, in order to ensure that the contents of the memory are maintained without being lost, the ratio of the refresh cycles to the read/write cycles is often set to a value rather greater than required. This results in a reduction in the data transfer rate.

SUMMARY OF THE INVENTION

In view of the above, it is an object of the present invention to provide a method and apparatus for controlling a memory in such a manner that data is transferred at a high rate without performing a greater number of refreshing operations than required.

It is another object of the present invention to provide a method and apparatus for controlling a memory in such a manner that when a data transfer cycle is performed according to the ratio determined so that a shorter period is assigned for performance of refresh cycles than to that for data transfer cycles, if a period of time longer than allowed has elapsed, then a refreshing operation is performed, out of turn thereby preventing the contents of the memory from being lost.

According to an aspect of the present invention, there is provided a memory controlling apparatus having the capability of performing communication between a memory including a DRAM divided into a plurality of blocks and a device capable of inputting and outputting data, the apparatus comprising:

first control means for transferring data between the memory and the device and also refreshing the memory while adjusting the frequencies of data transferring operations and refreshing operations; and second control means for controlling the timing in terms of the data transferring and refreshing operations, depending on the status of the communication between the memory and the device and also depending on designated values of the frequencies of data transferring and refreshing operations.

DESCRIPTION OF THE PREFERRED EMBODIMENTS

The present invention is described in further detail below with reference to preferred embodiments in conjunction with the accompanying drawings.

First Embodiment
Construction of Data Transfer System

Figure 1:
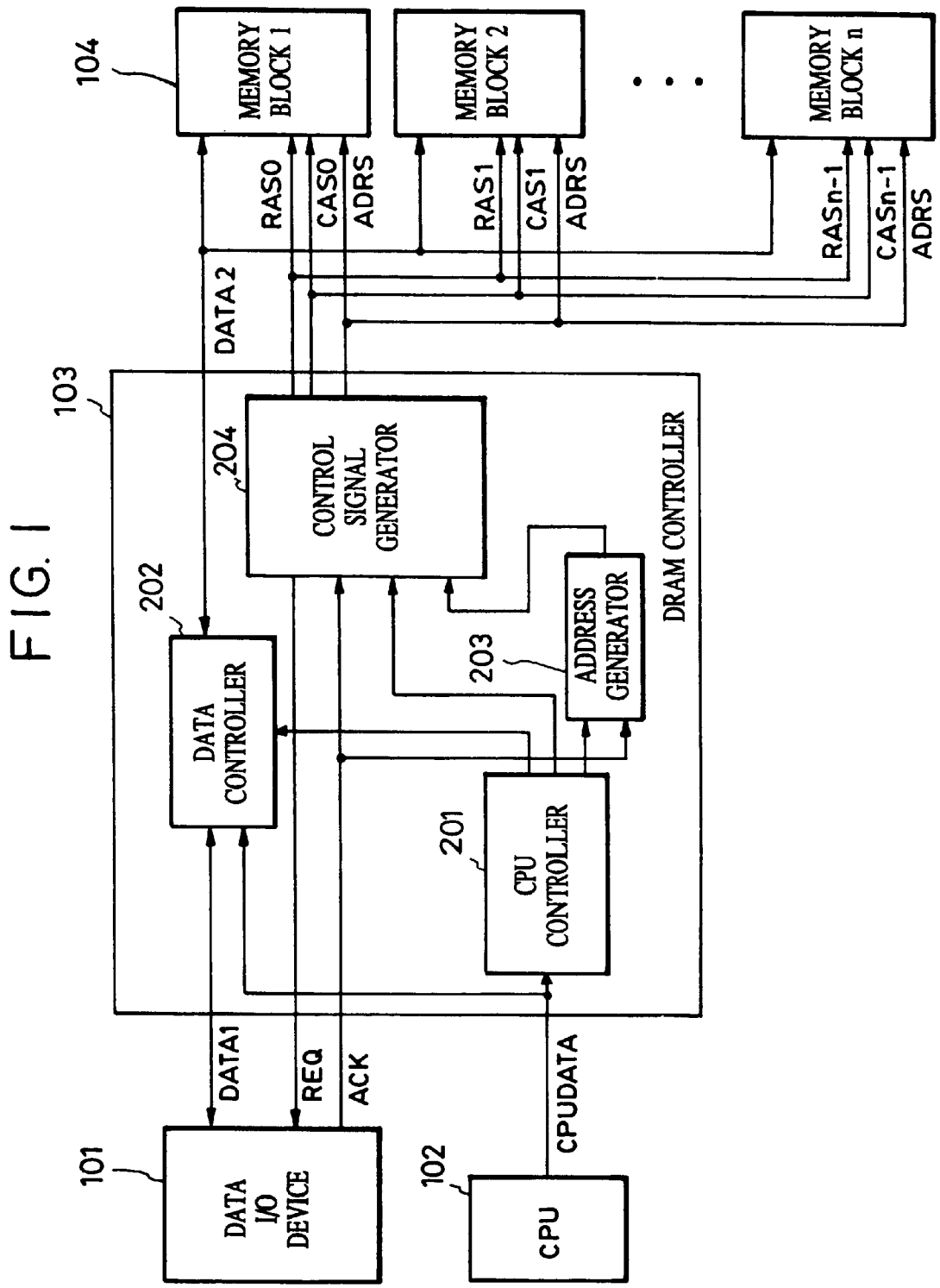
FIG. 1 is a block diagram illustrating a data transfer system serving as a memory controlling apparatus according to an embodiment of the present invention.

FIG. 1 illustrates the construction of a data transfer system which is an embodiment of a memory control apparatus according to the present invention.

In the present embodiment, the data transfer system comprises a data input-output device 101, a CPU 102, a DRAM controller 103, and a plurality of n memory blocks 104, where $n \geq 2$.

The DRAM controller 103 serves as a main component in the present invention and has a CPU controller 201, a data controller 202, an address generator 203, and a control signal generator 204. The CPU controller 201 is responsible for controlling the internal elements of the DRAM controller 103. More specifically, the CPU controller 201 controls the direction in which data is transferred over the CPU data bus and also performs the setting of registers.

Under the control of the CPU 102, the DRAM controller 103 transfers data between the data input-output device 101 and the memory blocks 104 constituting the DRAM. The communication between the DRAM controller 103 and the data input-output device 101 is controlled using a REQ (request) signal and an ACK (acknowledgment) signal.

If the data input-output device 101 receives a REQ signal from the control signal generator 204 of the DRAM controller 103, the data input-output device 101 makes a preparation for transferring data. When the data transferring operation is completed, the data input-output device 101 sends an ACK signal to the DRAM controller 103.

Figures 2, 3:
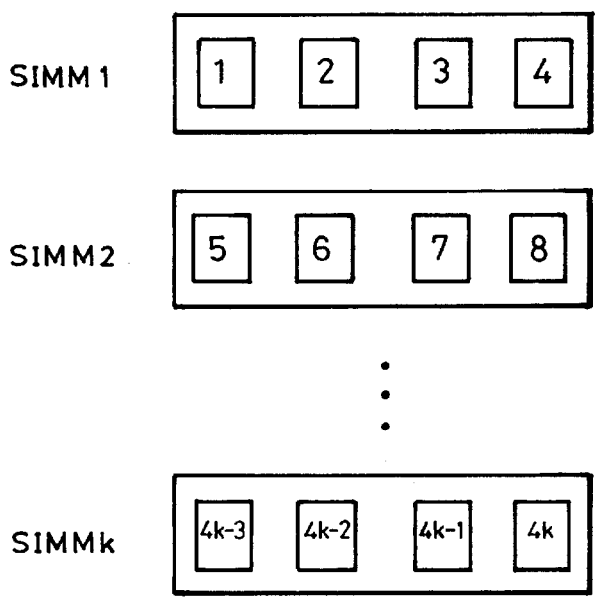
FIG. 2 is a conceptual diagram illustrating an example of an implementation of the memory blocks shown in FIG. 1 in SIMMs.
FIG. 3 is a schematic diagram illustrating the register structure of the DRAM controller shown in FIG. 1.

The memory blocks 104 are realized, as shown in FIG. 2, with a plurality of SIMMs (single in-line memory modules) wherein there are four memory blocks in each SIMM. The DRAM controller 103 controls these memory blocks 104 by applying different control signals (RAS, CAS) to the respective memory blocks 104. To this end, the numbers of bits included in the RAS and CAS signals generated by the DRAM controller 103 are designed so as to have values corresponding to the maximum number of SIMMs used and the number of control signals applied to each SIMM.

In the memory controlling apparatus shown in FIG. 1, the CPU controller 201 of the DRAM controller 103 includes registers (not shown in FIG. 1) constructed for example as shown in FIG. 3. In FIG. 3, a register MODE is used to set the data transfer mode such as memory read/write operation and CPU access modes. RWCNTMAX and REFCNTMAX are registers for adjusting the frequency of data transferring operations (i.e., how often each is performed) and refreshing operations in accordance with the present invention. More specifically, the RWCNTMAX and REFCNTMAX registers include values which define the maximum allowable numbers of continuous read/write and refreshing operations, respectively. That is, when read/write operations are performed as many times as the value designated by the RWCNTMAX register, a refreshing cycle is started. In the refreshing cycle, refreshing is performed as many times as REFCNTMAX. After that, a read/write cycle is again performed. RWCNTMAX and REFCNTMAX may be set to desired arbitrary values by inputting the values via an input device such as a keyboard (not shown). The data input via the keyboard is applied via the CPU 102 to the CPU controller 201, which in turn sets the RWCNTMAX and REFCNTMAX registers to have these designated values.

A register TIMEOUT_LIM is used to define the timeout period. After sending a REQ signal from the control signal generator 204, if an ACK signal is not received for some reason within the timeout period, the operation is automatically shifted to a refresh cycle. If the TIMEOUT_LIM register is set, the DRAM controller 103 counts the time elapsing from the time at which the DRAM controller 103 transmitted a REQ signal. When the DRAM controller 103 detects a system clock signal as many times as designated by TIMEOUT_LIM, the DRAM controller 103 determines that a timeout occurs and automatically shifts the operation to the next refresh cycle. TIMEOUT_LIM may also be set to a desired arbitrary value by inputting the value via an input device such as a keyboard (not shown). As in the case of the RWCNTMAX and REFCNTMAX registers, the data input via the keyboard is applied via the CPU 102 to the CPU controller 201, which in turn sets the TIMEOUT_LIM register to the designated value.

A register ADRSSET is used to define the initial address of the memory blocks 104 at which the read/write operation is started. After the read/write operation is started, the address is automatically incremented. A register MTYPE is used to define the memory size of each SIMM so that proper RAS and CAS signals are generated depending on the memory size of each SIMM. Registers START and END are used to store commands for starting and ending operations.

In the DRAM controller 103, the data controller 202 controls the direction in which data is transferred via the data bus between the address generator 203 and the memory blocks 104. The data controller 202 is also responsible for selecting data (DATA 1 or CPUDATA) written into the memory blocks 104. Each time data is transmitted from the data input-output device 101, the address generator 203 counts ACK signals starting from the initial address designated by the register ADRSSET, and increments the address at which the data is written in the memory. The resultant address information is sent to the control signal generator 204. The control signal generator 204 communicates with the data input-output device 101 by transmitting a REQ signal and receiving an ACK signal. Furthermore, the control signal generator 204 controls the memory read/write and refreshing operations by outputting control signals RAS and CAS and row and column address signals (ADRS) to the respective memory blocks 104.

Construction of the Control Signal Generator

Figure 4:
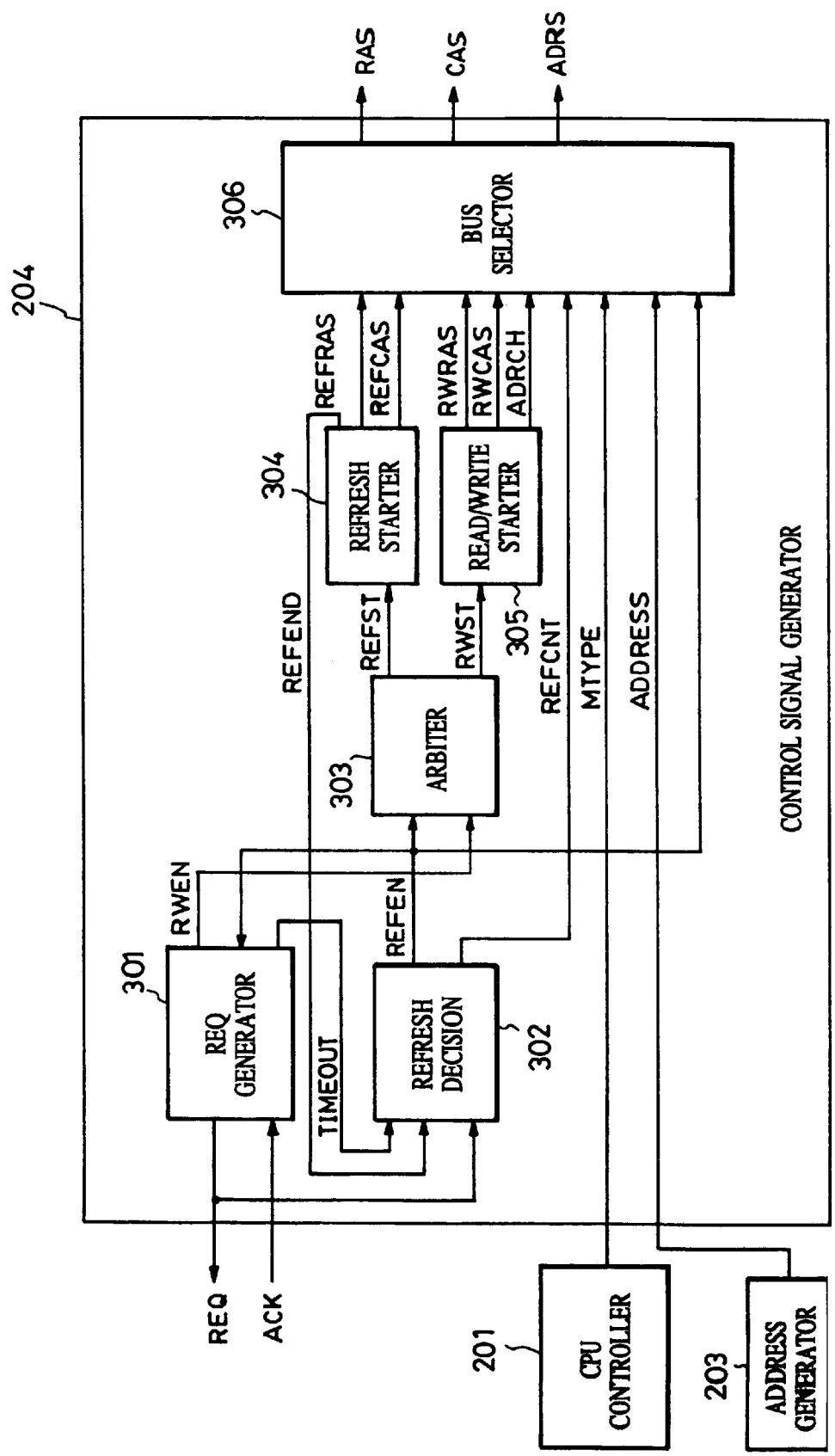
FIG. 4 is a block diagram illustrating the construction of the control signal generator shown in FIG. 1.

FIG. 4 illustrates an example of the internal structure of the control signal generator 204 shown in FIG. 1. The control signal generator 204 includes a REQ signal generator 301, a refresh decision unit 302, an arbiter 303 responsible for arbitration, a refresh starter 304, a read/write starter 305, and a bus selector 306. The REQ signal generator 301 generates a REQ signal and transmits it to the data input-output device 101.

If the register START is set as a result of a register setting operation performed by the CPU controller 201, the REQ signal generator 301 first outputs a REQ signal to the data input-output device 101. In response, the data input-output device 101 makes a preparation for transferring data. The REQ signal generator 301 then generates an RWEN signal so as to make a preparation for generating a control signal to the memory 104 to shift the operation to a read/write cycle. When the data input-output device 101 has become ready to transfer data, an ACK signal is transmitted from the data input-output device 101 to the control signal generator 204. Upon receipt of the ACK signal, the REQ signal generator 301 outputs another REQ signal. The above-described process is performed repeatedly until the entire operation is completed. If a predetermined time has elapsed since the REQ signal was output (that is, if as many system clock signals as TIMEOUT_LIM are counted), the REQ signal generator 301 outputs a TIMEOUT signal to the refresh decision unit 302.

The refresh decision unit 302 generates a REFEN signal in accordance with the signals REQ, TIMEOUT, and REFEND (generated each time a refresh cycle is completed), thereby making a preparation for shifting to a refresh cycle. The refresh decision unit 302 also counts the number of successive refresh operations by detecting the REFEND signal, and outputs the counted number (the number of successive refresh operations) as a REFCNT signal to the bus selector 306.

Figure 5A:
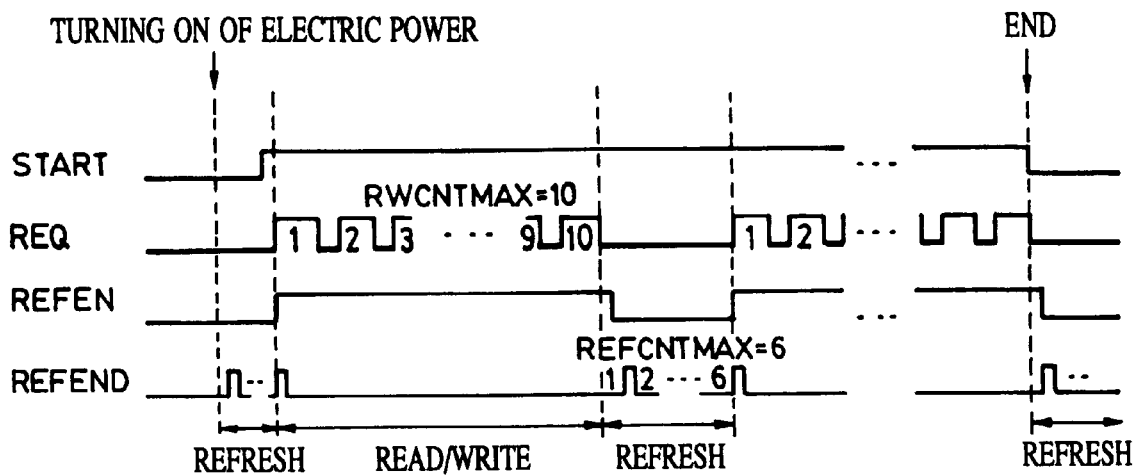
FIGS. 5A and 5B are timing charts illustrating the timing in terms of read/write and refreshing operations performed by the refresh decision unit shown in FIG. 4.

An example of the timing in terms of outputting REQ and REFEN signals is shown in the timing chart of FIG. 5A. In the present embodiment, the registers shown in FIG. 3 are set, by example, such that RWCNTMAX=10 and REFCNTMAX=6. The refresh decision unit 302 detects the REQ and REFEND signals and counts them. If the number of REQ signals counted reaches the value designated by the RWCNTMAX register, the operation is shifted from a read/write cycle to a refresh cycle. Similarly, if the number of REFEND signals counted reaches the value designated by the REFCNTMAX register, the operation is shifted from the refresh cycle to another read/write cycle. In this way, the operation is alternately shifted between read/write and refresh cycles as shown in FIG. 5A. The REFEN signal generated by the refresh decision unit 302 becomes low during refresh cycles and high during read/write cycles.

Figure 5B:
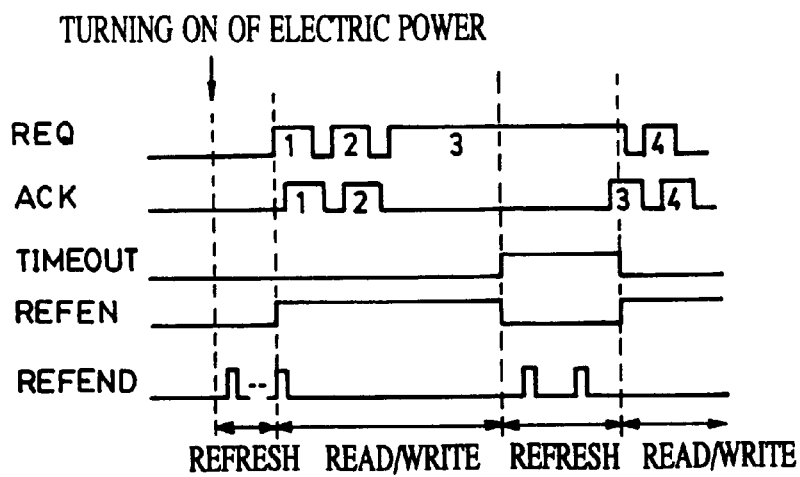

FIG. 5B is a timing chart illustrating an example of an operation in which timeout occurs. In the specific example shown in FIG. 5B, after sending a third REQ signal, no ACK signal is received within the predetermined time. When the predetermined time has elapsed (that is, when as many system clock signals as TIMEOUT_LIM are counted), the REQ signal generator 301 outputs a TIMEOUT signal to the refresh decision unit 302. In response to the TIMEOUT signal, the refresh decision unit 302 forces the operation to shift to a refresh cycle. This ensures that the DRAM memory 104 can maintain its contents even if the communication process does not proceed for some reason. When an ACK signal is received, the REQ signal generator 301 resets the TIMEOUT signal to a low level. In response, the refresh decision unit 302 makes the operation return to the read/write cycle.

The RWEN signal output by the REQ signal generator 301 and the REFEN signal output by the refresh decision unit 302 are sent to the arbiter 303. Depending on these signals, the arbiter 303 performs arbitration between the read/write task and the refresh task. To ensure that only a read/write operation or a refresh operation (one or the other) is performed at a time, the arbiter 303 accepts an operation when the other operation is completed. That is, only either the refresh starting signal REFST or the read/write starting signal RWST can be at an active state. The REFST signal is sent to the refresh starter 304, and the RWST signal is sent to the read/write starter 305.

Figure 6:
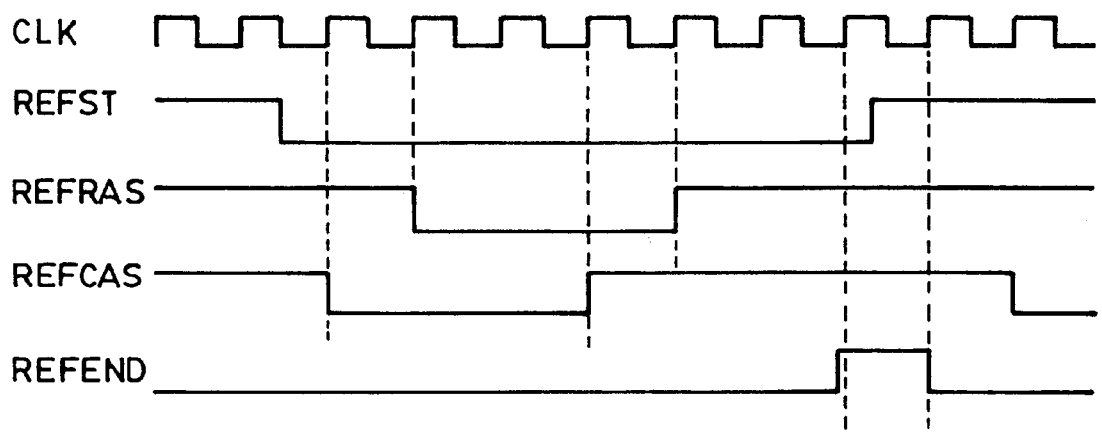
FIG. 6 is a timing chart illustrating the timing in terms of the operation performed by the refresh starter shown in FIG. 4.

On receipt of the REFST signal, the refresh starter 304 outputs REFRAS and REFCAS signals, as shown in FIG. 6, to the bus selector 306, which in turn generates RAS and CAS signals to start a refresh operation. Furthermore, the refresh starter 304 generates a REFEND signal at the end of each refresh cycle, and sends it to the counter provided in the refresh decision unit 302.

Figure 7:
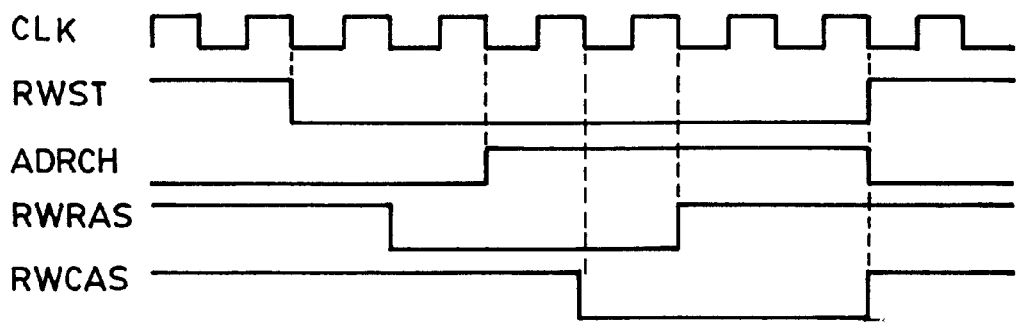
FIG. 7 is a timing chart illustrating the timing in terms of the operation performed by the read/write starter shown in FIG. 4.

On the other hand, when the read/write starter 305 receives the RWST signal, it outputs RWRAS and RWCAS signals, as shown in FIG. 7, to the bus selector 306, which in turn generates RAS and CAS signals to start a read/write operation. The read/write starter 305 generates an ADRCH signal during a period in which RAS and CAS signals are active. The ADRCH signal is used to switch the ADRS signal output from the bus selector 306 between row and column addresses.

Figure 8:
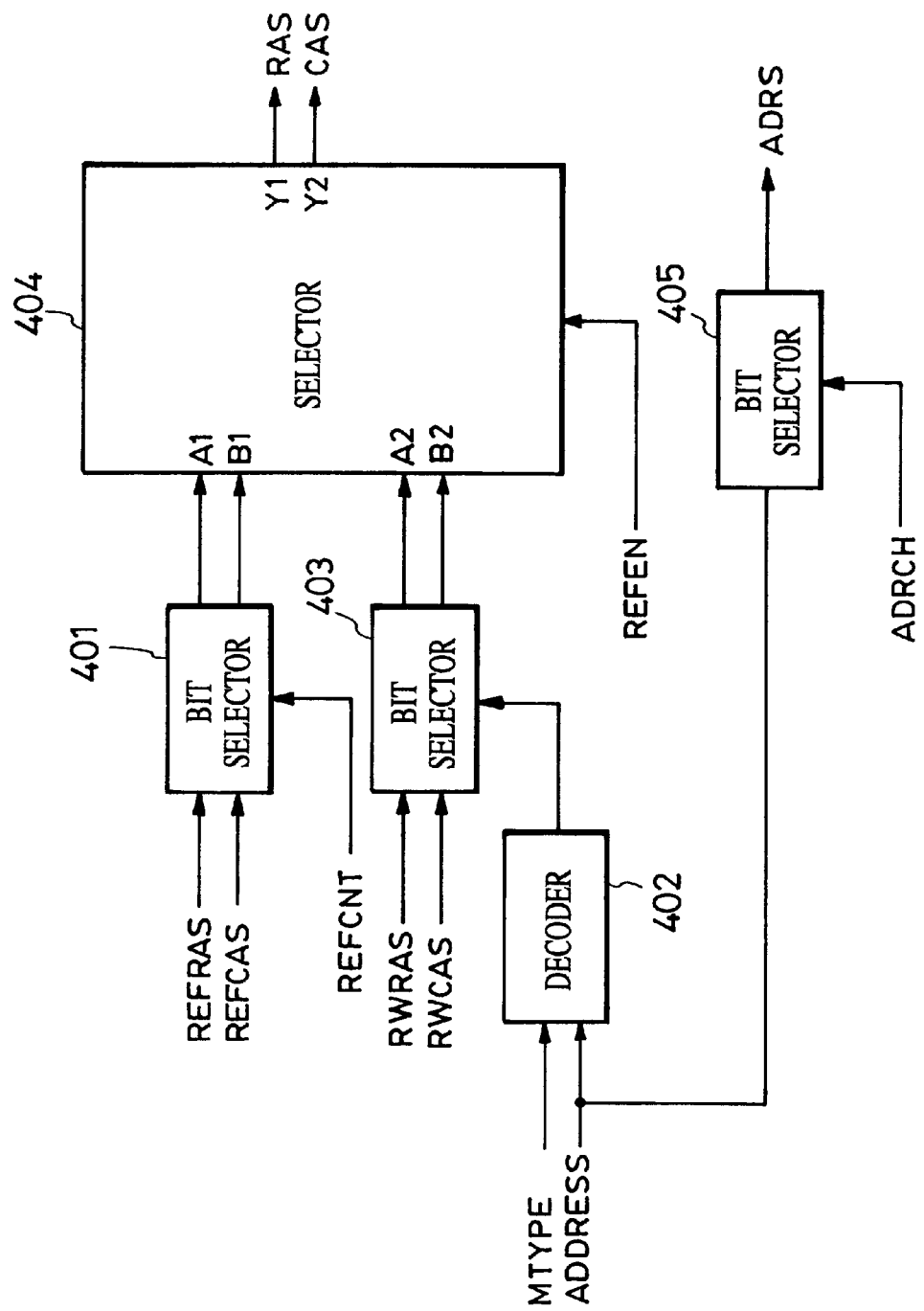
FIG. 8 is a block diagram illustrating the construction of the bus selector shown in FIG. 4.

FIG. 8 illustrates an example of the internal structure of the bus selector 306. The REFRAS and REFCAS signals generated by the refresh starter 304 are applied to a first bit selector 401. The first bit selector 401 puts the REFRAS and REFCAS signals onto bits of the output bus signal so that the bits correspond to the value of the REFCNT signal generated by the refresh decision unit 302 to represent the number of refresh operation, and the bit selector 401 puts a high-level value on the other bits so that all memory blocks 104 are equally refreshed in such a manner that one block is refreshed in a cycle and another block is refreshed in the following cycle.

The ADDRESS signal generated by the address generator 203 and also the MTYPE signal set in the register shown in FIG. 3 are applied to the decoder 402. The decoder 402 generates a decoding signal depending on the construction of the memory blocks 104 and also depending on the address to access. The resultant decoding signal is applied to a second bit selector 403. The second bit selector 403 puts the RWRAS and RWCAS signals on the bits, corresponding to the output of the decoder 402, of the output signal, and puts a high-level value on the other bits so that RAS and CAS signals are applied to the memory blocks 104 in such a manner that addresses continuously distributed over the memory blocks 104 are properly designated.

The bus signals output from the bit selectors 401 and 403 are applied to the selector 404. When the REFEN signal from the refresh decision unit 302 is at a low level, the selector 404 determines that the operation is in a refresh cycle and outputs the signals received from the bit selector 401 as the RAS and CAS signals. On the other hand, when the REFEN signal from the refresh decision unit 302 is at a high level, the selector 404 determines that the operation is in a read/write cycle, and outputs the signals received from the bit selector 403 as the RAS and CAS signals.

A third bit selector 405 selects proper bits from the ADDRESS signal in accordance with the ADRCH signal received from the read/write starter 305. More specifically, the bit selector 405 selects bits from the ADRS signal so that a row address is output when the ADRCH signal is at a low level while a column address is output when the ADRCH signal is at a high level.

In the present embodiment, as described above, the data transferring operation is performed while adjusting the ratio of the read/write operation between the memory blocks 104 and the input-output device 101 or the CPU 102 to the refresh operation, depending on the communication status.

Second Embodiment

A second embodiment of the present invention is described below. In this second embodiment, the present invention is applied to a memorize-and-copy system in a copying machine having the memory controlling apparatus described above in the first embodiment.

General Construction of the Copying Machine

Figure 9:
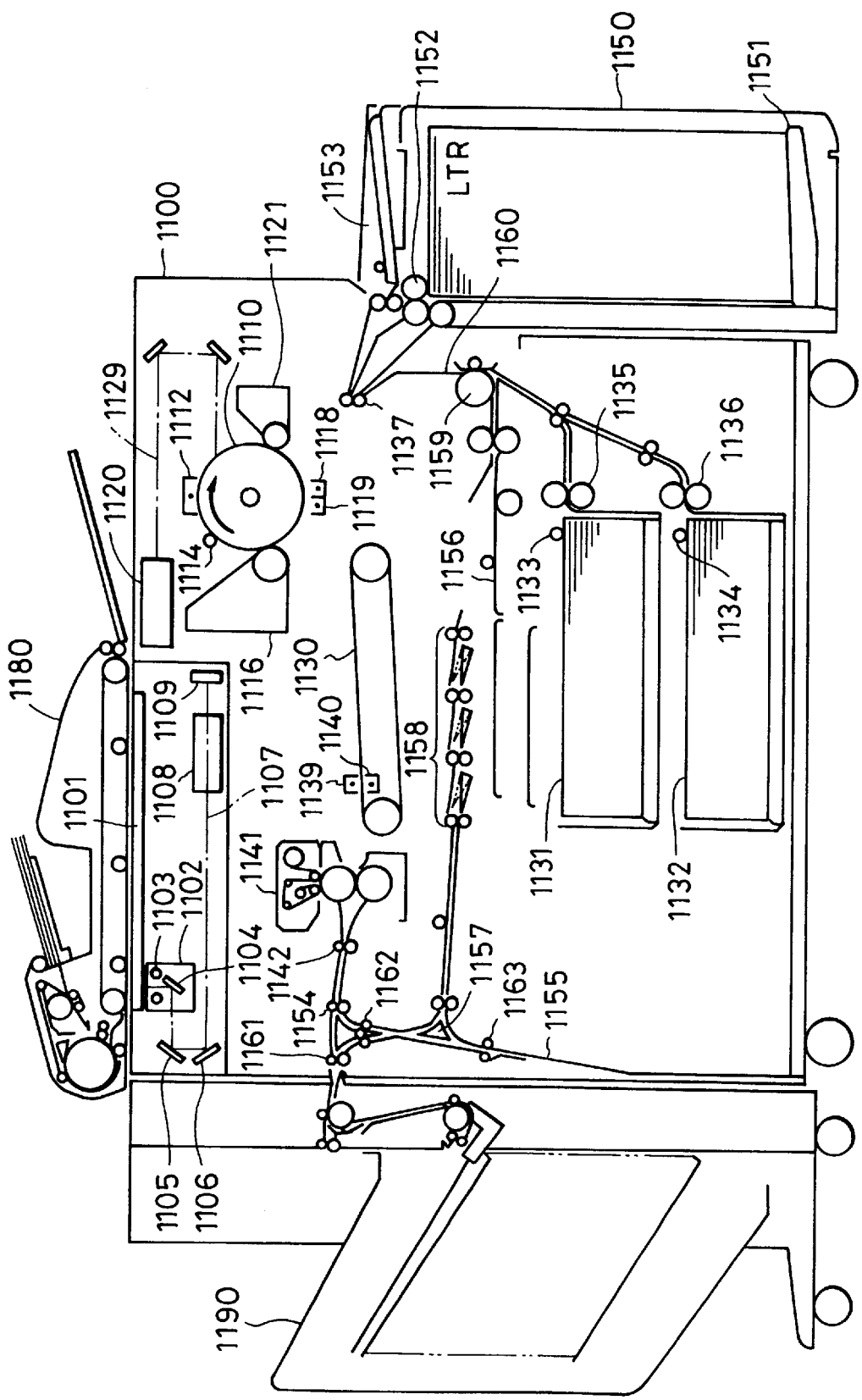
FIG. 9 is a longitudinal sectional view illustrating the cross-sectional structure of a copying machine which is an embodiment of an image forming apparatus according to the present invention.

FIG. 9 illustrates the cross-sectional structure of a copying machine which is an embodiment of an image forming apparatus according to the present invention. In FIG. 9, reference numeral 1100 denotes the main body of the copying machine. Reference numeral 1180 denotes an automatic document feeder 1180 which is provided in a removable fashion on the main body 1100 so that documents are automatically fed therefrom. The main body can detect which type of automatic document feeder is mounted thereon.

Reference numeral 1101 denotes a document glass plate on which a document is placed. Reference numeral 1102 denotes a scanner including a document illumination lamp 1103 and a scanning mirror 1104. The scanner 1102 is moved by a motor (not shown) back and forth along a fixed direction. Light reflected from the document is directed by the scanning mirrors 1104–1106 to a lens 1108, which in turn focuses the light onto a CCD sensor 1109 thereby forming an image of the document thereon.

Reference numeral 1107 denotes an exposure controller including a laser and a polygon scanner. The optical image is converted by the image sensor 1109 to an electric image signal, which is then subjected to image processing as will be described later. The exposure controller 1120 generates a laser beam 1129 modulated according to the above image signal so that a photosensitive drum 1110 is exposed to the laser beam 1129.

In the peripheral region around the photosensitive drum 1110, there are provided a primary charger 1112, a developing unit 1121, a transfer charger 1118, and cleaning unit 1116, and a pre-exposure lamp 1114. In the image forming unit 1126 including these elements, the photosensitive drum 1110 is rotated by a motor (not shown) in a clockwise direction as denoted by an arrow in FIG. 9. During the rotation, the photosensitive drum 1110 is first charged to a proper potential by the primary charger 1112, and then illuminated by the laser beam 1129 supplied from the exposure controller 1120 so that an electrostatic latent image is formed on the photosensitive drum 1110. The electrostatic latent image formed on the photosensitive drum 1110 is then developed by the developing unit 1121 into a visible toner image.

Copying paper is fed from an upper cassette 1131 or a lower cassette 1132 into the main body via a pickup roller 1133 or 1134 and further via a paper feeding roller 1135 or 1136. The copying paper is then carried onto a transfer belt by a registration roller 1137, where the toner image developed on the photosensitive drum 1110 is transferred onto the copying paper by the transfer charger 1118. After that, the excessive toner remaining on the photosensitive drum 1110 is removed by the cleaning unit 1116, and the charge remaining on the photosensitive drum 1110 is removed by the pre-exposure lamp 1114.

The copying paper with the toner image transferred thereto is separated from the transfer belt 1130. The toner image is again charged by pre-fusing chargers 1139 and 1140. The copying paper is then carried to a fuser 1141, which fuses the toner image by means of heat and pressure. After that, the copying paper is ejected through an ejection roller 1142 to the outside of the main body 1100 of the apparatus.

Although not shown in FIG. 9, there is provided an attracting charger for attracting the copying paper fed via the registration roller 1137 to the transfer belt 1130, and there is also a transfer belt roller for rotating the transfer belt 1130 and also attracting, in cooperation with the attracting charger, the copying paper to the transfer belt 1130.

The main body 1100 of the apparatus is provided with a deck 1150 having the capacity of for example 4,000 sheets of copying paper. In the deck 1150, there is a lifter 1151 which moves upward depending on the amount of copying paper so that a paper feeding roller 1152 is always in contact with the copying paper at the top position. There is also a manual feed tray having te capacity of 100 sheets of copying paper.

In FIG. 9, reference numeral 1154 denotes a paper ejection flapper which switches the paper path depending on the operation mode either into a path for both-side or multiple copying operation or into a path to the outlet. The copying paper moved forward by the paper ejection roller 1142 is introduced by the paper ejection flapper 1154 to a both-side copying path or a multiple-copying path. In FIG. 9, reference numeral 1158 denotes a lower paper carrying path along which the copying paper given from the paper ejection roller 1142 is carried to a paper refeeding tray 1156 after turning the copying paper upside down by passing the copying paper through a turning-over path 1155. Reference numeral 1157 denotes a multiple-copying flapper for switching the paper carrying path between the both-side copying path and the multiple-copying path. If this flapper is tilted to left, the copying paper is carried directly to the lower paper carrying path 1158 without being passed through the turning-over path 1155. Reference numeral 1159 denotes a paper feeding roller for feeding the copying paper to the photosensitive drum 1126 through a path 1160. Reference numeral 1161 denotes a paper ejection roller disposed near the paper ejection flapper 1154 and serving to eject the copying paper, which is directed by the paper ejection flapper 1154 toward the paper ejection side, to the outside of the machine.

In the both-side or multiple copying mode, the paper ejection flapper 1154 is moved to the upper position so that the copying paper on which an image has been formed on one surface is directed to the turning-over path 1155. The turned-over copying paper is then carried to the paper refeeding tray 1156 through the lower carrying path 1158. In the both-side copying mode, the multiple-copying flapper 1157 is tilted to the right, while it is tilted to left in the multiple copying mode. In the operation of forming an image on the back side of the copying paper or in the operation in the multiple copying mode, the copying paper placed on the paper refeeding tray 1156 is fed sheet by sheet starting at the bottom by the paper feeding roller 1158 through the path 1169 to the registration roller 1137 in the main body.

When it is desired to eject the copying paper to the outside of the main body in an upside down fashion, the paper ejection flapper 1154 is moved to the upper position and the flapper 1157 is tilted to the right so that the copied paper is carried to the carrying path 1155. After the trailing end of the copying paper has passed over a first carrying roller 1162, the copying paper is carried by a turning-over roller 1163 to a second carrying roller and is then ejected upside down by the paper ejection roller 1161 to the outside of the machine.

Image Forming Circuit

Figure 10:
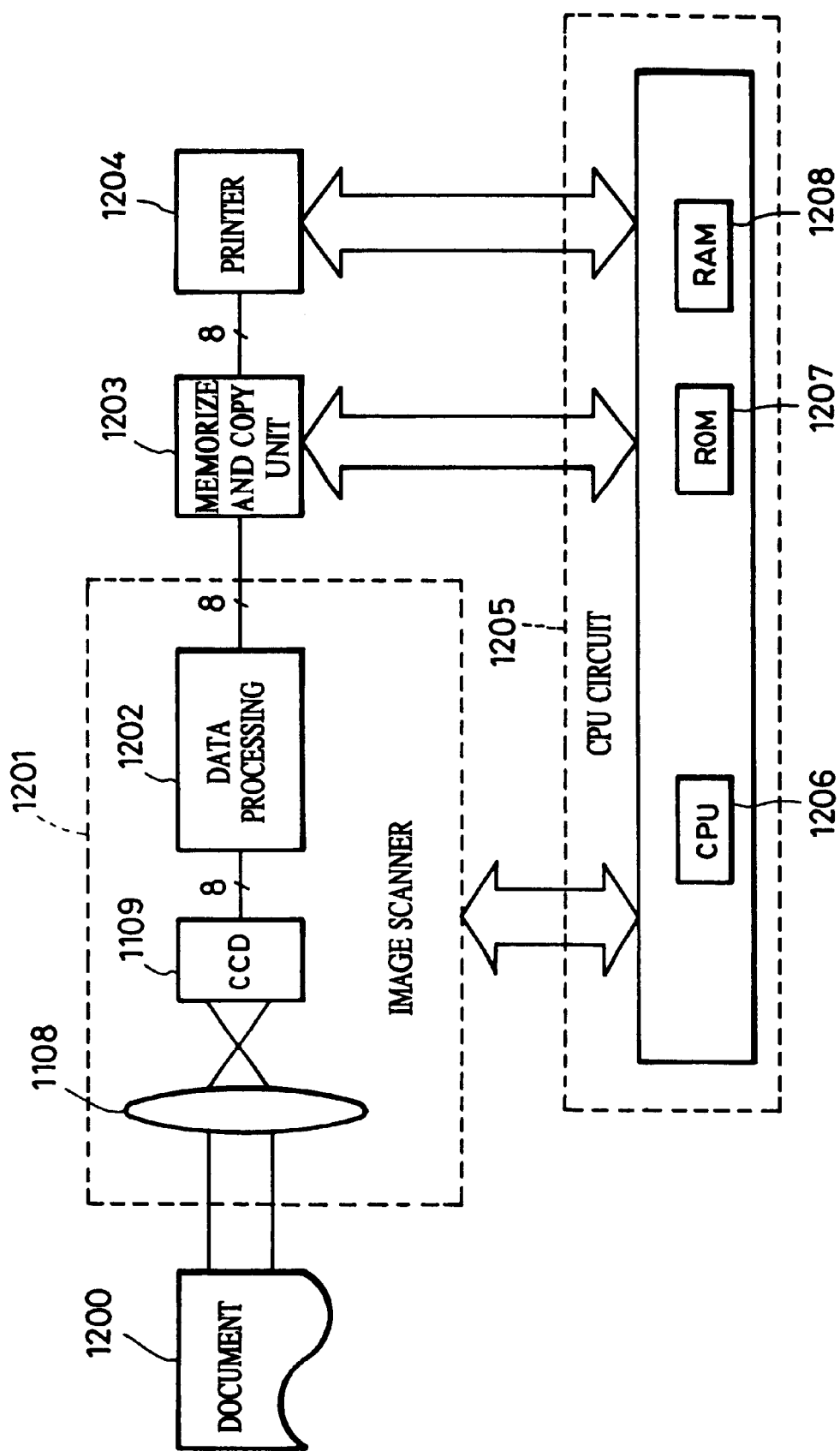
FIG. 10 is a block diagram illustrating the circuit configuration of the image forming apparatus shown in FIG. 9.

FIG. 10 illustrates an example of the circuit configuration of the image forming circuit of the copying machine shown in FIG. 9. An image sensing unit 1201 includes a CCD sensor 1109 and a data processing circuit 1202. An image of a document 1200 is formed on the CCD sensor 1109 via a lens 1108. The CCD sensor 1109 converts the optical image to an electric analog signal. The resultant analog signal representing the image information is applied to the data processing circuit 1202. The data processing circuit 1202 performs a sample-and-hold operation and dark level correction on the analog signal. The resultant analog signal is then converted to a digital signal. The resultant digital image signal is subjected to shading correction (to compensate for the variations in the characteristics of sensor elements for sensing the image of the document and also for the variation in the intensity of light emitted by the document illumination lamp) and also to a magnification process. The digital image signal is then applied to a memorize-and-copy unit 1203.

After performing y-conversion, binarization, memorization, and smoothing, the memorize-and-copy unit 1203 outputs the image signal to a printer 1204.

The printer 1204 comprises the exposure controller 1120 including the laser, the image forming unit 1126, and the paper carrying system, which have been described earlier with reference to FIG. 9. When the image signal is received from the memorize-and-copy unit 1203, the image signal is applied to the exposure controller 1120 and the image is recorded on copying paper in the above-described manner.

Referring again to FIG. 10, a CPU circuit 1205, comprising a CPU 1206, a ROM 1207, and a RAM 1208, controls the image sensing unit 1201, the memorize-and-copy unit 1203, and the printer 1204 thereby controlling the sequence of operations of the present copying machine.

Construction of the Memorize-and-Copy Unit

Figure 11:
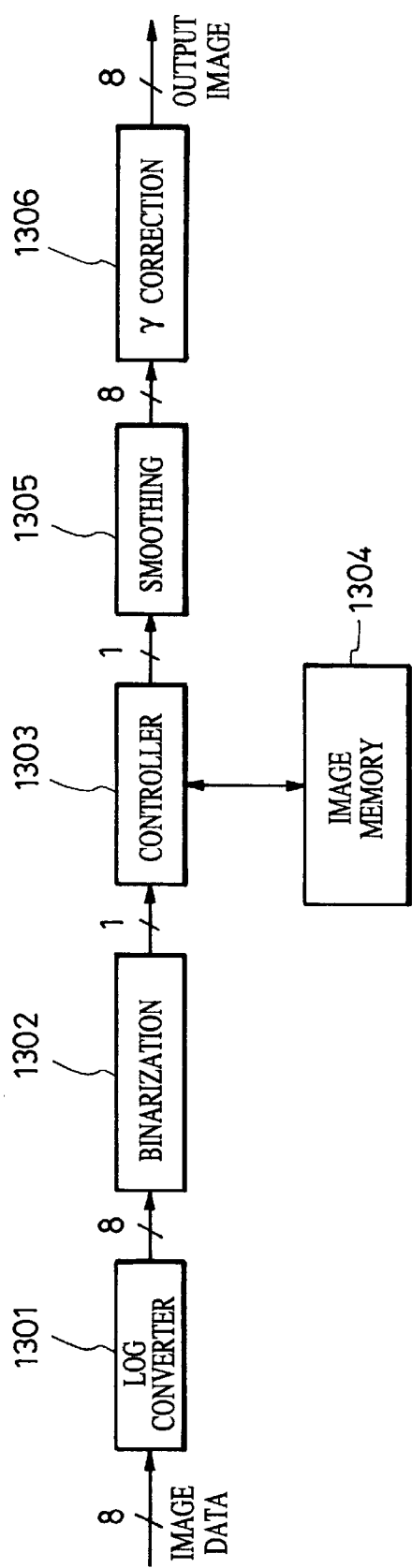
FIG. 11 is a block diagram illustrating the circuit configuration of the memorize-and-copy unit shown in FIG. 10.

The memorize-and-copy unit 1203, which is an essential part in the present embodiment, is described below. FIG. 11 illustrates the details of the memorize-and-copy unit 1203. The image signal received from the image sensing unit 1201 is applied, as luminance data (representing the intensity of black), to the memorize-and-copy unit 1203. In the memorize-and-copy unit 1203, the received image signal is first applied to a log converter 1301. The log converter 1301 includes a look-up table and converts the luminance data to density data in accordance with the look-up table.

The resultant density data is applied to a binarization unit 1302. The binarization unit 1302 converts the multi-level density data to binary data having a density value equal to either 0 or 255. The resultant 8-bit binary image-data is further converted, in the binarization unit 1302, to 1-bit image-data having a value equal to either 0 or 1. This result in a reduction in the amount of image data stored in the memory.

However, if the image is simply converted into a binary form, the number of gray levels is reduced from 256 to 2, and thus a great reduction in the image quality occurs. In particular, the quality degradation is serious for image data having a great number of halftone levels, such as a photograph image. To avoid such a problem, pseudohalftone is represented using the binary data. In this specific embodiment, the binarization unit 1302 employs the error diffusion method to realize pseudohalftone. In the error diffusion method, as is well known, the density data of each pixel is converted to binary data in such a manner that when the gray level of a pixel is greater than a fixed threshold value, the density of the pixel is regarded as 255, while the density of the pixel is regarded as 0 if the gray level of the pixel is lower than the threshold value. After that, an error signal is created from the difference between the actual density data and the binarized data, and the error is diffused into adjacent pixels. The diffusion of the error is performed by multiplying the error by weighting factors predefined in the form of a matrix, and then adding the resultant values to the adjacent pixels. This ensures that the density of the original image is represented in a pseudo-fashion by the binary data.

The binarized image data is applied to a controller 1303. In accordance with information, given by the CPU circuit 1205 in the control system of the main body 1100 shown in FIG. 10, about the mode in which the document is sensed and the mode in which copying paper is output, the controller 1303 determines the operation mode so that the input image data is immediately output or so that the image data is output after completion of reading all image data. In the case of the immediate output mode, the image data of the first sheet is output while at the same time storing the image data in the image memory 1304. On the other hand, in the mode in which the image is output later, all the image data is first stored in the image memory and then output.

After the mode is determined by the controller 1303 as described above, the image data is stored in the image memory 1304. The image memory 1304 includes memory blocks 104 and a memory controllers 102 and 103 described earlier in the first embodiment of the invention. The data input-output device 101 shown in FIG. 1 corresponds to the controller 1303 shown in FIG. 11, and the memory controllers 102 and 103 communicate with the controller 1303 during the operation of writing and reading image data into and from the memory blocks 104.

A plurality of image data stored in the memory blocks 104 are output from the image memory 1304 in the order corresponding to the edit mode designated through the operation control unit (not shown). For example, when an "electronic sorting" mode is selected, the image is output in order by kinds of documents. This makes it possible to electronically realize a sorter.

The image data read from the image memory 1304 and the image data which is not stored in the image memory 1304 are applied to a smoothing unit 1305. The smoothing unit 1305 converts the 1-bit data to 8-bit data having a value equal to either 0 or 255. The image data is replaced by the weighted mean value obtained by the calculating the sum of products of the density of adjacent pixels and predefined factors in the form of a matrix. Thus, the binary data is converted to multi-level data depending on the density of adjacent pixels so that the resultant multi-level data reproduces a high-quality image similar to the original image.

The smoothed image data is applied to a γ correction unit 1306. The γ correction unit 1306 performs a γ correction on the received image data using a look-up table so as to generate density data which matches the characteristics of the printer. The γ correction unit 1306 also adjusts the density data in accordance with the density level designated through the operation control unit.

Other Embodiments

In the second embodiment described above, the memory controlling apparatus according to the present invention is applied to a copying machine. However, the present invention is not limited to such an application. The invention may also be applied to various types of image forming apparatus such as a printer, a facsimile machine, etc., and also to various types of information devices such as a scanner, an OCR, etc. The invention may also be applied to a memory device for use in a personal computer.

When the present invention is applied to a facsimile machine, the data input-output device 101 shown in FIG. 1 may have the capability of data compression so that image data of documents is stored via the DRAM controller 103 into the memory blocks 104 after compressing the image data.

Furthermore, the present invention may be applied to not only a system including a plurality of devices but also an apparatus composed of a single device. Furthermore, the present invention may also be applied to a system whose functions according to the invention are realized by supplying a program to the system. In this case, software or a program according is read into an apparatus from a storage medium, thereby implementing the function of the invention in the system of the apparatus.

In the memory controlling apparatus according to the present invention, as described above, data is transferred between the memory including the DRAM divided into the plurality of blocks and the device having the capability of inputting and outputting data in such a manner that the frequencies of memory read/writ and refresh operations are adjusted to variable values and the read/write and refresh operations are performed at the ratio corresponding to the designated frequencies. This makes it possible to adjust the number of refresh operations within a fixed period of time to an optimum value depending on the data transfer rate thus making it possible to transfer data at a high speed without having to perform a greater number of refreshing operations than required.

Furthermore, in the present invention, when an ACK signal is not returned due to for example a communication error, a timeout routine is performed so that a refreshing operation is temporarily performed when a period of time longer than allowed has elapsed thereby avoiding the risk of losing the contents of the memory.

What is claimed is:

1. A memory controlling apparatus having the capability of performing communication between a memory including a DRAM divided into a plurality of blocks and a device capable of inputting and outputting data, said apparatus comprising:

a transmitter which performs a transmission operation to transmit data between the memory and the device repeatedly in a transmission cycle;

a refresh circuit which performs a refresh operation to refresh the memory repeatedly in a refresh cycle; and a controller in which the number of repetition times are set for the operations in the transmission and refresh cycles, respectively, said controller being arranged to control said transmitter and said refresh circuit so that the transmission and refresh cycles are executed alternately and that a current cycle is switched to the other when the operation corresponding to the current cycle is repeated the respective number of repetition times.

2. A memory controlling apparatus according to claim 1, wherein said controller controls said transmitter and said refresh circuit so that when an ACK signal is not returned from the device within a predetermined time in the transmission cycle the transmission cycle is switched to the refresh cycle.

3. A memory controlling apparatus according to claim 1 or 2, wherein the number of repetition times for the refresh operation is smaller than that for the transmission operation.

4. A memory controlling apparatus according to claim 1 or 2, further comprising a setting unit which sets the number of repetition times for transmission and refresh operations, respectively, for said controller.

5. A memory controlling apparatus according to claim 1 or 2, wherein the device having the capability of inputting and outputting data also has an edit capability to store image data of a plurality of documents sensed by an AU image sensor into the memory via said controller and to read the image data from the memory, via said controller, in an order depending on the edit mode designated via an edit mode designator.

6. A memory controlling apparatus according to claim 5, wherein the device having the capability of inputting and outputting data is connected to a recorder which records the image data output from the device onto a recording medium.

7. A memory controlling apparatus according to claim 5, wherein the device having the capability of inputting and outputting data includes a data compressor arranged to compress the image data of a document sensed via the image sensor before storing the image data into the memory via said controller.

8. A method of controlling communication between a memory including a DRAM divided into a plurality of blocks and a device capable of inputting and outputting data, comprising:

a first step, of performing a transmission operation to transmit data between the memory and the device, repeatedly; and a second step, of performing a refresh operation to refresh the memory, repeatedly, wherein the number of repetition times is set for the operations in said first and second steps respectively and said first and second steps are executed alternately, and wherein a switch is made from a currently executed one of said first and second steps to the other when the operation corresponding to the current step is repeated the respective number of repetition times.

9. A method according to claim 8, wherein, in said first step, when an ACK signal is not returned from the device within a predetermined time, said first step is switched to said second step.

10. A method according to claim 8 or 9, wherein, the number of repetition times for the refresh operation is smaller than that for the transmission operation.

11. A method according to claim 8 or 9, wherein, the number of repetition times for transmission and refresh operations can be set respectively by a user.

12. A storage medium including:

first program code, by which data is transferred between a memory including a DRAM divided into a plurality of blocks and a device capable of inputting and outputting data, repeatedly;

second program code, by which the memory is refreshed, repeatedly; and third program code, by which the number of repetition times are set for the operations defined by said first and second program codes respective and by which execution of said first and second program codes is controlled so that said first and second program codes are executed alternately, and so that a switch is made from a currently executed one of said first and second program codes to the other when the operation corresponding to the current program code is repeated the respective number of repetition times.

* * * * *